US010550711B2

United States Patent
Chamberlain et al.

(10) Patent No.: US 10,550,711 B2
(45) Date of Patent: Feb. 4, 2020

(54) VISUAL INDICATOR OF COATING THICKNESS

(71) Applicant: Rolls-Royce Corporation, Indianapolis, IN (US)

(72) Inventors: Adam Lee Chamberlain, Mooresville, IN (US); Andrew Joseph Lazur, Laguna Beach, CA (US); Kang N. Lee, Strongsville, OH (US)

(73) Assignee: Rolls Royce Corporation, Indianapolis, IN (US)

( * ) Notice: Subject to any disclaimer, the term of this patent is extended or adjusted under 35 U.S.C. 154(b) by 308 days.

(21) Appl. No.: 15/381,825

(22) Filed: Dec. 16, 2016

(65) Prior Publication Data

US 2017/0101883 A1  Apr. 13, 2017

Related U.S. Application Data

(63) Continuation of application No. 14/789,676, filed on Jul. 1, 2015, now Pat. No. 9,556,743.

(Continued)

(51) Int. Cl.
*F01D 11/12* (2006.01)
*C23C 4/10* (2016.01)
(Continued)

(52) U.S. Cl.
CPC .............. *F01D 11/122* (2013.01); *B05D 1/36* (2013.01); *B05D 5/061* (2013.01); *B05D 7/14* (2013.01);
(Continued)

(58) Field of Classification Search
CPC .......... F01D 11/122; F01D 9/02; F01D 5/288; C23C 28/044; C23C 16/24; C23C 14/14;
(Continued)

(56) References Cited

U.S. PATENT DOCUMENTS

| 4,774,150 A | 9/1988 | Amano et al. |
| 4,922,113 A | 5/1990 | Melancon |

(Continued)

FOREIGN PATENT DOCUMENTS

| CA | 2686332 A1 | 5/2010 |
| EP | 1777731 A1 | 4/2007 |

(Continued)

OTHER PUBLICATIONS

Examination Report from counterpart European Application No. 15175074.2, dated Oct. 25, 2017, 6 pp.

(Continued)

*Primary Examiner* — Jonathan C Langman
(74) *Attorney, Agent, or Firm* — Shumaker & Sieffert, P.A.

(57) ABSTRACT

In some examples, a coating may include at least one feature that facilitates visual determination of a thickness of the coating. For example, the coating may include a plurality of microspheres disposed at a predetermined depth of the coating. The plurality of microspheres may define a distinct visual characteristic. By inspecting the coating and viewing at least one of the microspheres, the thickness of the coating may be estimated. In some examples, the plurality of microspheres may be embedded in a matrix material, and the distinct visual characteristic of the microspheres may be different than the visual characteristic of the matrix material. In other examples, the at least one feature may include at least one distinct layer in the coating system that includes a distinct visual characteristic, such as a color of the distinct layer.

10 Claims, 7 Drawing Sheets

Related U.S. Application Data (60) Provisional application No. 62/020,545, filed on Jul. 3, 2014.

(51) Int. Cl.

| | | |
|---|---|---|
| *B05D 5/06* | (2006.01) | |
| *B05D 1/36* | (2006.01) | |
| *F01D 5/28* | (2006.01) | |
| *C23C 28/04* | (2006.01) | |
| *C23C 14/06* | (2006.01) | |
| *C23C 16/22* | (2006.01) | |
| *C23C 4/04* | (2006.01) | |
| *C23C 4/134* | (2016.01) | |
| *C23C 14/14* | (2006.01) | |
| *C23C 16/24* | (2006.01) | |
| *C04B 41/89* | (2006.01) | |
| *C04B 41/00* | (2006.01) | |
| *C04B 41/50* | (2006.01) | |
| *C04B 41/52* | (2006.01) | |
| *G01B 11/06* | (2006.01) | |
| *C23C 28/00* | (2006.01) | |
| *C23C 4/067* | (2016.01) | |
| *B32B 18/00* | (2006.01) | |
| *B05D 7/14* | (2006.01) | |
| *C04B 35/50* | (2006.01) | |
| *C04B 35/622* | (2006.01) | |
| *C04B 41/87* | (2006.01) | |
| *F01D 9/02* | (2006.01) | |

(52) U.S. Cl.
CPC ............. *B32B 18/00* (2013.01); *C04B 35/50* (2013.01); *C04B 35/62222* (2013.01); *C04B 41/009* (2013.01); *C04B 41/5024* (2013.01); *C04B 41/52* (2013.01); *C04B 41/87* (2013.01); *C04B 41/89* (2013.01); *C23C 4/04* (2013.01); *C23C 4/067* (2016.01); *C23C 4/10* (2013.01); *C23C 4/134* (2016.01); *C23C 14/06* (2013.01); *C23C 14/14* (2013.01); *C23C 16/22* (2013.01); *C23C 16/24* (2013.01); *C23C 28/04* (2013.01); *C23C 28/044* (2013.01); *C23C 28/321* (2013.01); *C23C 28/34* (2013.01); *C23C 28/345* (2013.01); *F01D 5/288* (2013.01); *F01D 9/02* (2013.01); *G01B 11/0616* (2013.01); *F05D 2220/32* (2013.01); *F05D 2230/312* (2013.01); *F05D 2260/83* (2013.01); *F05D 2300/211* (2013.01)

(58) Field of Classification Search
CPC ........... C23C 4/134; C23C 4/04; C23C 16/22; C23C 14/06; C23C 28/04; C23C 4/067; C23C 28/345; C23C 28/34; C23C 28/321; C23C 4/10; C04B 41/87; C04B 35/62222; C04B 35/50; C04B 41/52; C04B 41/5024; C04B 41/009; C04B 41/89; C04B 41/85; C04B 2111/807; B05D 7/14; B05D 1/36; B05D 5/061; B32B 18/00; G01B 11/0616; F05D 2300/211; F05D 2230/312; F05D 2220/32; F05D 2260/83
See application file for complete search history.

(56) References Cited

U.S. PATENT DOCUMENTS

| | | | |
|---|---|---|---|
| 5,187,542 A | 2/1993 | Madzsar | |
| 5,270,116 A | 12/1993 | Melancon et al. | |
| 6,644,917 B2 | 11/2003 | Zhao et al. | |
| 6,682,665 B2 | 1/2004 | Watson | |
| 6,730,918 B2 | 5/2004 | Srivastava et al. | |
| 6,943,357 B2 | 9/2005 | Srivastava et al. | |
| 7,221,445 B2 | 5/2007 | Earthman et al. | |
| 7,231,817 B2 | 6/2007 | Smed et al. | |
| 7,270,890 B2 | 9/2007 | Sabol et al. | |
| 7,510,776 B2 | 3/2009 | Choy et al. | |
| 7,619,728 B2 | 11/2009 | Ogburn et al. | |
| 7,858,952 B2 | 12/2010 | Feist et al. | |
| 8,012,374 B2 | 9/2011 | van Ooij et al. | |
| 8,173,266 B2 | 5/2012 | Choy et al. | |
| 2007/0015283 A1 | 1/2007 | Choy et al. | |
| 2009/0162632 A1* | 6/2009 | Kirby ............... | C23C 30/00 428/304.4 |
| 2010/0154422 A1 | 6/2010 | Kirby et al. | |
| 2011/0299987 A1 | 12/2011 | Billotey et al. | |
| 2012/0285226 A1 | 11/2012 | Laurer et al. | |
| 2013/0084163 A1 | 4/2013 | Wiebe | |
| 2013/0266420 A1 | 10/2013 | Kidane et al. | |
| 2016/0003092 A1 | 1/2016 | Chamberlain et al. | |

FOREIGN PATENT DOCUMENTS

| | | |
|---|---|---|
| GB | 2455850 A | 6/2009 |
| JP | 2008308374 A | 12/2008 |
| JP | 2009133240 A | 6/2009 |
| WO | 9924812 A1 | 5/1999 |
| WO | 2015126476 A2 | 8/2015 |

OTHER PUBLICATIONS

Matejicek et al., "Alternative Methods for Determination of Composition and Porosity in Abradable Materials," Materials Characterization, Elsevier, vol. 57, No. 1, Jul. 1, 2006, pp. 17-29.
Notice of Allowance from counterpart Canadian Application No. 2,895,986 dated Apr. 10, 2017, 1 pp.
Partial Search Report from counterpart European Application No. 15175074.2, dated Nov. 17, 2015, 9 pp.
Extended Search Report from counterpart European Application No. 15175074.2, dated Mar. 16, 2016, 11 pp.
Office Action from Canadian Counterpart Patent application No. 2,895,986, dated Jul. 21, 2016, 5 pp.
Response to Search Report dated Mar. 16, 2016, from counterpart European Application No. 15175074.2, filed Sep. 30, 2016, 8 pp.
Response to Canadian Office Action dated Jul. 21, 2016 from counterpart Canadian application No. 2,895,986, filed Oct. 26, 2016, 22 pp.
Prosecution History from U.S. Appl. No. 14/789,676, dated Jan. 22, 2016 through Nov. 25, 2016, 48 pp.
Response to Examination Report dated Oct. 25, 2017, from counterpart European Application No. 15175074.2, filed Feb. 6, 2018, 8 pp.

* cited by examiner

VISUAL INDICATOR OF COATING THICKNESS

RELATED APPLICATIONS

This application is a continuation of U.S. application Ser. No. 14/789,676, filed Jul. 1, 2015, which claims the benefit of U.S. Provisional Application No. 62/020,545, filed Jul. 3, 2014. The entire contents U.S. application Ser. No. 14/789,676 and U.S. Provisional Application No. 62/020,545 are incorporated herein by reference.

TECHNICAL FIELD

The disclosure relates to coatings and techniques for determining a thickness of a coating.

BACKGROUND

The components of high-temperature mechanical systems, such as, for example, gas-turbine engines, must operate in severe environments. For example, the high-pressure turbine blades, vanes, blade tracks and blade shrouds exposed to hot gases in commercial aeronautical engines typically experience metal surface temperatures of about 1000° C., with short-term peaks as high as 1100° C.

Components of high-temperature mechanical systems may include a Ni- or Co-based superalloy substrate or a ceramic-based substrate, such as a ceramic matrix composite. The substrate can be coated with a thermal barrier coating (TBC), an environmental barrier coating (EBC), or both to reduce surface temperatures. The TBC, EBC, or both may allow use of the component at higher temperatures, which may improve efficiency of the high-temperature mechanical system.

In addition to raising the inlet temperature, gas turbine power and efficiency also may be improved by reducing the clearance between a gas turbine blade and a surrounding blade track or blade shroud. One method of reducing the clearance between blade and track or shroud includes coating the blade track or blade shroud with an abradable coating. As the turbine blade rotates, the tip of the turbine blade may contact the abradable coating and wear away a portion of the coating to form a groove in the abradable coating corresponding to the path of the turbine blade. The intimate fit between the blade and abradable coating provides a seal, which may reduce or eliminate leakage of gas around the blade tip and increase the efficiency of the gas turbine engine by up to 5% in some cases.

SUMMARY

The disclosure describes coatings that include at least one feature that facilitates visual determination of a thickness of the coating. For example, the coating may include a plurality of microspheres disposed at a predetermined depth of the coating. The plurality of microspheres may define a distinct visual characteristic. By inspecting the coating and viewing at least one of the microspheres, the thickness of the coating may be estimated. In some examples, the plurality of microspheres may be embedded in a matrix material, and the distinct visual characteristic of the microspheres may be different than the visual characteristic of the matrix material.

In other examples, the at least one feature may include at least one distinct layer in the coating system that includes a distinct visual characteristic, such as a color of the distinct layer. Similar to the microspheres, the at least one distinct layer may be disposed at a predetermined depth of the coating. By inspecting the coating and viewing the distinct layer, the remaining thickness of the coating may be estimated.

In order to minimize losses in gas turbine efficiency, proper clearance should be maintained between a gas turbine blade and a surrounding track or shroud during the entire life of the component. The abradable coating described herein includes at least one feature that may provide a simple visual indicator detectable during an on-wing inspection. This visual indicator may provide a simple and accurate indication of the ability of the abradable coating to provide proper sealing with the gas turbine blade, resulting in the system meeting efficiency targets.

In some examples, the disclosure describes an article including a substrate and a coating on the substrate. The coating may include at least one abradable layer. The at least one abradable layer may include a matrix material a plurality of microspheres located within the at least one abradable layer at a predetermined depth from an outer surface of the coating. The plurality of microspheres may define a visual characteristic distinct from the matrix material. The plurality of microspheres may include at least one rare earth silicate, at least one rare earth oxide, or at least one rare earth silicate and at least one rare earth oxide.

In some examples, the disclosure describes an article including a substrate and a coating on the substrate. The coating may include at least one abradable layer, a neodymium silicate layer, an erbium silicate layer, and a gadolinium silicate layer. The neodymium silicate layer, the erbium silicate layer, and the gadolinium silicate layer may be adjacent to each other within the coating.

In some examples, the disclosure describes a method including forming a coating on a substrate. The coating may include at least one abradable layer. The at least one abradable layer may include a matrix material and a plurality of microspheres located within the at least one abradable layer at a predetermined depth from an outer surface of the coating. The plurality of microspheres may define a visual characteristic distinct from the matrix material. The plurality of microspheres may include at least one rare earth silicate, at least one rare earth oxide, or at least one rare earth silicate and at least one rare earth oxide.

In some examples, the disclosure describes a method including forming a coating on a substrate. The coating may include at least one abradable layer, a neodymium silicate layer, an erbium silicate layer, and a gadolinium silicate layer. The neodymium silicate layer, the erbium silicate layer, and the gadolinium silicate layer may be adjacent to each other within the coating.

In some examples, the disclosure describes a method including visually inspecting an abradable coating, wherein the coating comprises at least one abradable layer, and wherein the at least one abradable layer comprises a matrix material and a plurality of microspheres located within the at least one abradable layer at a predetermined depth from an outer surface of the coating. The plurality of microspheres may define a visual characteristic distinct from the matrix material. The plurality of microspheres may include at least one rare earth silicate, at least one rare earth oxide, or at least one rare earth silicate and at least one rare earth oxide. The method also may include determining a wear level of the abradable coating based at least in part on observation of at least one of the plurality of microspheres.

The details of one or more examples are set forth in the accompanying drawings and the description below. Other features, objects, and advantages will be apparent from the description and drawings, and from the claims.

DETAILED DESCRIPTION

The present disclosure describes an abradable coating that includes at least one feature that facilitates visual determination of a thickness of the abradable coating. In some examples, the abradable coating may be formed on a component of a high temperature mechanical system, such as a gas turbine blade track or blade shroud. During operation of the gas turbine engine, the blade track or blade shroud is exposed to gases. Rubbing of a gas turbine engine blade against at least a portion of the abradable coating, erosion by the gases flowing past the abradable coating and contact with debris in the gases, or both, may remove portions of the abradable coating (e.g., cause the coating to wear). The at least one feature may facilitate visual determination of a remaining thickness of the abradable coating. In some examples, the visual inspection may be performed at room temperature using visible wavelengths, UV wavelengths, or both. Additionally or alternatively, X-ray inspection or ultrasonic techniques may be used to detect a depth of the at least one feature below an outer surface of the abradable coating.

In some examples, the abradable coating may include a plurality of layers (e.g., at least two abradable layers). At least one abradable layer of the plurality of abradable layers may include the at least one feature. In some examples, the abradable coating may be part of a coating system that includes at least one other layer. For example, the coating system may include at least one of an environmental barrier coating (EBC) layer or a bond layer.

In some examples, the at least one feature that facilitates visual determination of a thickness of the abradable coating may include a plurality of microspheres that possess a distinctive visual characteristic under visual or UV-assisted inspection. In some examples, the abradable coating may include an abradable layer comprising a matrix material and the plurality of microspheres that define a visual characteristic distinct from the matrix material. In some examples, the matrix material may include at least one of a rare earth silicate, a stabilized zirconium oxide, a mullite, or barium-strontium-aluminum silicate (BSAS).

The plurality of microspheres may include at least one rare earth silicate, at least one rare earth oxide, or at least one rare earth silicate and at least one rare earth oxide. The rare earth silicate may include at least one of yttrium monosilicate ($Y_2SiO_5$), yttrium disilicate ($Y_2Si_2O_7$), ytterbium monosilicate ($Yb_2SiO_5$), ytterbium disilicate ($Yb_2Si_2O_7$), erbium monosilicate ($Er_2SiO_5$), erbium disilicate ($Er_2Si_2O_7$), neodymium monosilicate ($Nd_2SiO_5$), neodymium disilicate ($Nd_2Si_2O_7$), gadolinium monosilicate ($Gd_2SiO_5$), or gadolinium disilicate ($Gd_2Si_2O_7$). The rare earth oxide may include at least one of yttrium oxide ($Y_2O_3$), ytterbium oxide ($Yb_2O_3$), erbium oxide ($ErO_3$), neodymium oxide ($Nd_2O_3$), or gadolinium oxide ($Gd_2O_3$). In some examples, the at least one rare earth silicate, the at least one rare earth oxide, or the at least one rare earth silicate and rare earth oxide is present in the microspheres in a glass phase. In other examples, the at least one rare earth silicate, the at least one rare earth oxide, or the at least one rare earth silicate and the at least one rare earth oxide is present in the microspheres in a crystalline or semi-crystalline phase. The microspheres may be substantially solid or may be hollow.

In some examples, the plurality of microspheres may include a ceramic oxide and the at least one rare earth silicate, the at least one rare earth oxide, or the at least one rare earth silicate and at least one rare earth oxide. For example, the plurality of microspheres may include aluminum oxide doped with yttrium oxide, yttrium monosilicate, or yttrium disilicate; or may include yttrium-aluminum-garnet (YAG) doped with ytterbium oxide, ytterbium monosilicate, or ytterbium disilicate.

In some examples, at least some microspheres of the plurality of microspheres may include between about 0.1 atomic percent (at. %) and about 10 at. % of at least one element selected from the Lanthanide series of the periodic table, excluding ytterbium, e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), or lutetium (Lu).

In some examples, the at least one feature that facilitates visual determination of a thickness of the abradable coating may include a plurality of layers that possess respective distinct visual characteristics under visual or UV-assisted inspection. For example, the abradable coating may include a neodymium silicate layer, an erbium silicate layer, and a gadolinium silicate layer. Each of these three layers may appear differently (e.g., have different colors) under visual inspection.

By incorporating the at least one feature that facilitates visual determination of a thickness of the abradable coating at a predetermined depth within the thickness of the abradable coating, the at least one feature may be used to determine a remaining thickness of the abradable coating. For example, the thickness of the abradable coating between the at least one feature and the immediately underlying layer (e.g., EBC, bond layer, or substrate) may be known. Thus, when the at least one feature is exposed at a surface of the abradable coating, the remaining thickness of the abradable coating at that location may be determined to be the thickness between the at least one feature and the immediately underlying layer. In some examples, this may facilitate at least one of determination of a remaining life of the abradable coating, determination of a size, depth, or both of damage to the abradable coating, and removal and repair of the abradable coating to maintain clearances between the abradable coating and a blade tip below a predetermined level to maintain a desired efficiency level of the gas turbine engine.

Although the description describes abradable coatings, in other examples, the subject matter described herein may be applied to coatings of other types, such as abrasive coatings, thermal barrier coatings, environmental barrier coatings, self-lubricating coatings, or the like. The layer structure and compositions may differ for these different applications, but layers including a plurality of microspheres in a matrix material or a plurality of layers with distinct visual characteristics may also be used in these other coating systems.

Figure 1:
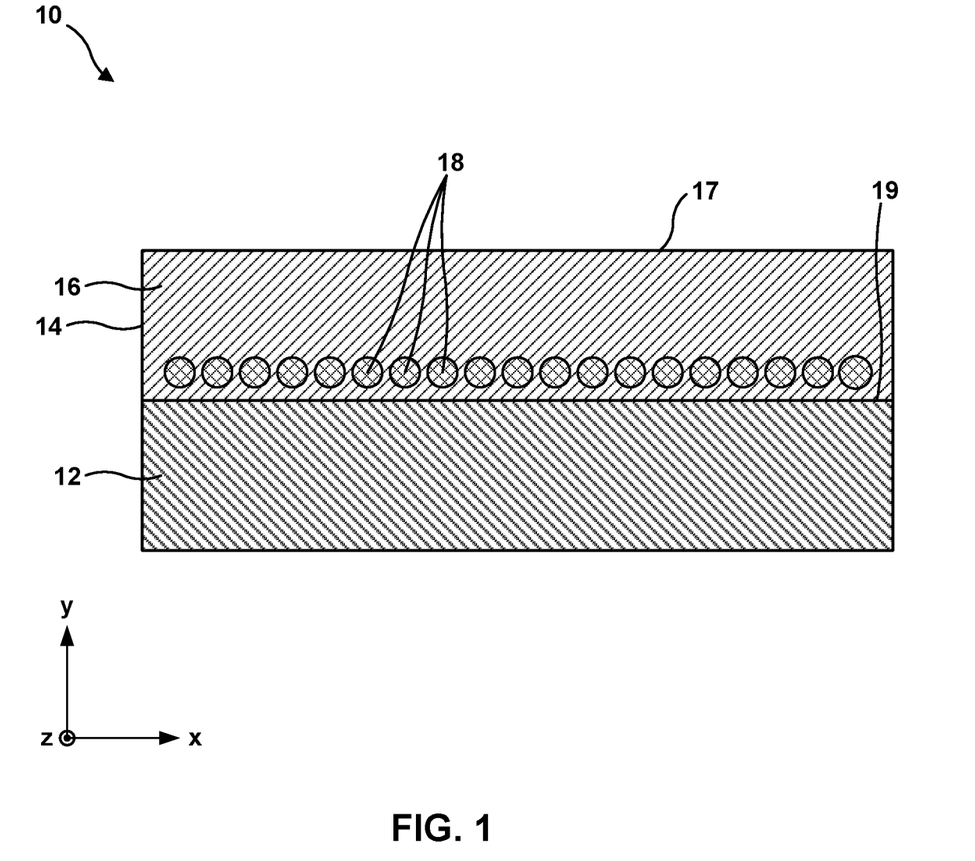
FIG. 1 is a conceptual cross-sectional diagram illustrating an example article that includes an example abradable coating including a plurality of microspheres including at least one rare earth silicate, at least one rare earth oxide, or at least one rare earth silicate and at least one rare earth oxide.

FIG. 1 is a conceptual diagram illustrating a cross-sectional view of an example article 10 that includes a substrate 12 coated with an abradable coating 14. In the example illustrated in FIG. 1, abradable coating 14 includes a plurality of microspheres 18 and a matrix material 16 and is on a surface 19 of substrate 12.

Article 10 may be a component of a high temperature mechanical system, such as, for example, a gas turbine engine or the like. For example, article 10 may be a turbine blade track or a turbine blade shroud.

Substrate 12 may include a metal alloy that includes silicon, a ceramic, or a ceramix matrix composite (CMC). In examples in which substrate 12 includes a ceramic, the ceramic may be substantially homogeneous. In some examples, a substrate 12 that includes a ceramic includes, for example, a Si-containing ceramic, such $SiO_2$, silicon carbide (SiC) or silicon nitride ($Si_3N_4$); $Al_2O_3$; aluminosilicate (e.g., $Al_2SiO_5$); or the like. In other examples, substrate 12 includes a metal alloy that includes Si, such as a molybdenum-silicon alloy (e.g., $MoSi_2$) or a niobium-silicon alloy (e.g., $NbSi_2$).

In examples in which substrate 12 includes a CMC, substrate 12 includes a matrix material and a reinforcement material. The matrix material includes a ceramic material, such as, for example, SiC, $Si_3N_4$, $Al_2O_3$, aluminosilicate, $SiO_2$, or the like. The CMC further includes a continuous or discontinuous reinforcement material. For example, the reinforcement material may include discontinuous whiskers, platelets, or particulates. As other examples, the reinforcement material may include a continuous monofilament or multifilament weave.

Article 10 further includes abradable coating 14, which in the example of FIG. 1 is directly on surface 19 of substrate 12. Abradable coating 14 includes a plurality of microspheres 18 and a matrix material 16. Matrix material 16 may include at least one of a rare earth silicate, a stabilized zirconium oxide, mullite, or BSAS. In some examples, matrix material 16 includes at least one rare earth silicate.

The plurality of microspheres 18 may possess a visual characteristic that, under visual or UV-assisted inspection, is distinct from a visual characteristic of matrix material 16. For example, the plurality of microspheres may include microspheres including at least one rare earth silicate, at least one rare earth oxide, or at least one rare earth silicate and at least one rare earth oxide, and may include a composition different from the composition of matrix material 16. In some examples, the at least one rare earth silicate, the at least one rare earth oxide, or the at least one rare earth silicate and the at least one rare earth oxide is present in the microspheres in a glass phase. In other examples, the at least one rare earth silicate, the at least one rare earth oxide, or the at least one rare earth silicate and the at least one rare earth oxide is present in the microspheres in a crystalline or semi-crystalline phase.

The rare earth silicate may include at least one of yttrium monosilicate ($Y_2SiO_5$), yttrium disilicate ($Y_2Si_2O_7$), ytterbium monosilicate ($Yb_2SiO_5$), ytterbium disilicate ($Yb_2Si_2O_7$), erbium monosilicate ($Er_2SiO_5$), erbium disilicate ($Er_2Si_2O_7$), neodymium monosilicate ($Nd_2SiO_5$), neodymium disilicate ($Nd_2Si_2O_7$), gadolinium monosilicate ($Gd_2SiO_5$), or gadolinium disilicate ($Gd_2Si_2O_7$). The rare earth oxide may include at least one of yttrium oxide ($Y_2O_3$), ytterbium oxide ($Yb_2O_3$), erbium oxide ($ErO_3$), neodymium oxide ($Nd_2O_3$), or gadolinium oxide ($Gd_2O_3$). The plurality of microspheres 18 may be substantially solid or may be hollow.

In some examples, the plurality of microspheres may include a ceramic oxide and the at least one rare earth silicate, the at least one rare earth oxide, or the at least one rare earth silicate and at least one rare earth oxide. For example, the plurality of microspheres may include aluminum oxide doped with yttrium oxide, yttrium monosilicate, or yttrium disilicate; or may include yttrium-aluminum-garnet (YAG) doped with ytterbium oxide, ytterbium monosilicate, or ytterbium disilicate.

In some examples, the plurality of microspheres 18 may fluoresce when exposed to UV radiation. For example, the plurality of microspheres 18 may include at least one of yttrium monosilicate ($Y_2SiO_5$), yttrium disilicate ($Y_2Si_2O_7$), ytterbium monosilicate ($Yb_2SiO_5$), or ytterbium disilicate ($Yb_2Si_2O_7$), all of which may fluoresce when exposed to UV radiation. In some examples, the plurality of microspheres 18 may possess a visual characteristic observable in the visible wavelengths that is different from a visual characteristic of matrix material 16. For example, the color of the plurality of microspheres 18 may be different than the color of matrix materials. For example, the plurality of microspheres 18 may include at least one of erbium monosilicate ($Er_2SiO_5$), erbium disilicate ($Er_2Si_2O_7$), neodymium monosilicate ($Nd_2SiO_5$), neodymium disilicate ($Nd_2Si_2O_7$), gadolinium monosilicate ($Gd_2SiO_5$), or gadolinium disilicate ($Gd_2Si_2O_7$).

In some examples, the plurality of microspheres 18 may include at least one dopant. The at least one dopant may include at least one element from the Lanthanide series of the periodic table (excluding ytterbium). For example, the dopant may include at least one of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), or lutetium (Lu). In examples in which the plurality of microspheres 18 include at least one dopant, the plurality of microspheres 18 may include between about 0.1 atomic percent (at. %) and about 10 at. % of the at least one dopant.

In some examples, the plurality of microspheres 18 may include a mean diameter, median diameter, or the like, that is less than a thickness of the layer in which the plurality of microspheres 18 are located. For example, the plurality of microspheres 18 may have a mean diameter, median diameter, or the like, that is less than the thickness of abradable coating 14 (measured in the y-axis direction of FIG. 1, where orthogonal x-y-z axes are shown for ease of description only). In some examples, the plurality of microspheres 18 may include a mean diameter, median diameter, or the like, that is less than 1000 micrometers (e.g., between 1 micrometer and 1000 micrometer), or less than about 100 micrometers (e.g., between 1 micrometer and 100 micrometer). In some examples, at least some microspheres of plurality of microspheres 18 may have a diameter less than a mean or median diameter of pores in abradable coating 14.

The plurality of microspheres 18 may be located at a predetermined depth from an outer surface 17 of abradable coating 14. For example, the predetermined depth may be a substantially consistent (e.g., consistent or nearly consistent) depth from surface 19 of substrate 12. When at least some of the plurality of microspheres 18 are exposed at a surface of abradable coating 14 due to removal of a portion of abradable coating 14, the remaining thickness of abradable coating 14 at that location may be determined by observing the microspheres 18 and knowing the distance (e.g., in the y-axis direction of FIG. 1) between the plurality of microspheres 18 and surface 19 of substrate 12. In some examples, this may facilitate at least one of determination of a remaining life of abradable coating 14, determination of a size, depth, or both of damage to abradable coating 14, and removal and repair of abradable coating 14 to maintain clearances between abradable coating 14 and substrate 12 below a predetermined level to maintain a desired efficiency level of the gas turbine engine.

In some examples, abradable coating 14 defines a thickness, measured in a direction substantially normal to surface 19 of substrate 12 (e.g., measured in the y-axis direction of FIG. 1), between about 0.508 millimeters (about 0.02 inch) and about 2.032 mm (about 0.08 inch). The thickness of abradable coating 14 may be selected to be sufficient to allow abrasion of a portion of abradable coating 14 by a gas turbine engine blade without the blade contacting substrate 12.

Abradable coating 14 may be formed as a porous structure, which may facilitate abrasion of a portion of abradable coating 14 upon contact with a gas turbine engine blade or another moving component with which abradable coating 14 forms a seal. In some examples, abradable coating 14 includes porosity between about 25 vol. % and about 50 vol. %. In other examples, abradable coating 14 includes a porosity between about 35 vol. % and about 45 vol. %, or a porosity of about 40 vol. %. Porosity of abradable coating 14 may be defined as a volume of pores or cracks in abradable coating 14 divided by a total volume of abradable coating 14 (including both the volume of material in abradable coating 14 and the volume of pores/cracks in abradable coating 14). In some examples, the porosity of abradable coating 14 may be controlled to vary throughout at least a portion of abradable coating 14. For example, the porosity of abradable coating 14 may be controlled to be lower in a portion of abradable coating 14 closer to surface 19 of substrate 12 and greater in a portion of abradable coating 14 further from surface 19 of substrate 12.

Abradable coating 14 may be formed over or formed directly on substrate 12 using, for example, a thermal spraying technique, such as, for example, air plasma spraying, as described in further detail with reference to FIGS. 5A and 5B.

Abradable coating 14 including matrix material 16 and plurality of microspheres 18 may facilitate visual inspection of a thickness of abradable coating 14 by including the plurality of microspheres 18 at a predetermined depth within the thickness of abradable coating 14. In some examples, this visual inspection may occur at room temperature. The plurality of microspheres 18 may possess a visual characteristic under visual or UV-assisted inspection (e.g., color or fluorescence) that is distinct from a visual characteristic of matrix material 16. In some examples, this may facilitate at least one of determination of a remaining life of the abradable coating 14, determination of a size, depth, or both of damage to abradable coating 14, or removal and repair of the abradable coating to maintain clearances between the abradable coating 14 and a blade tip below a predetermined level to maintain a desired efficiency level of the gas turbine engine.

Figure 2:
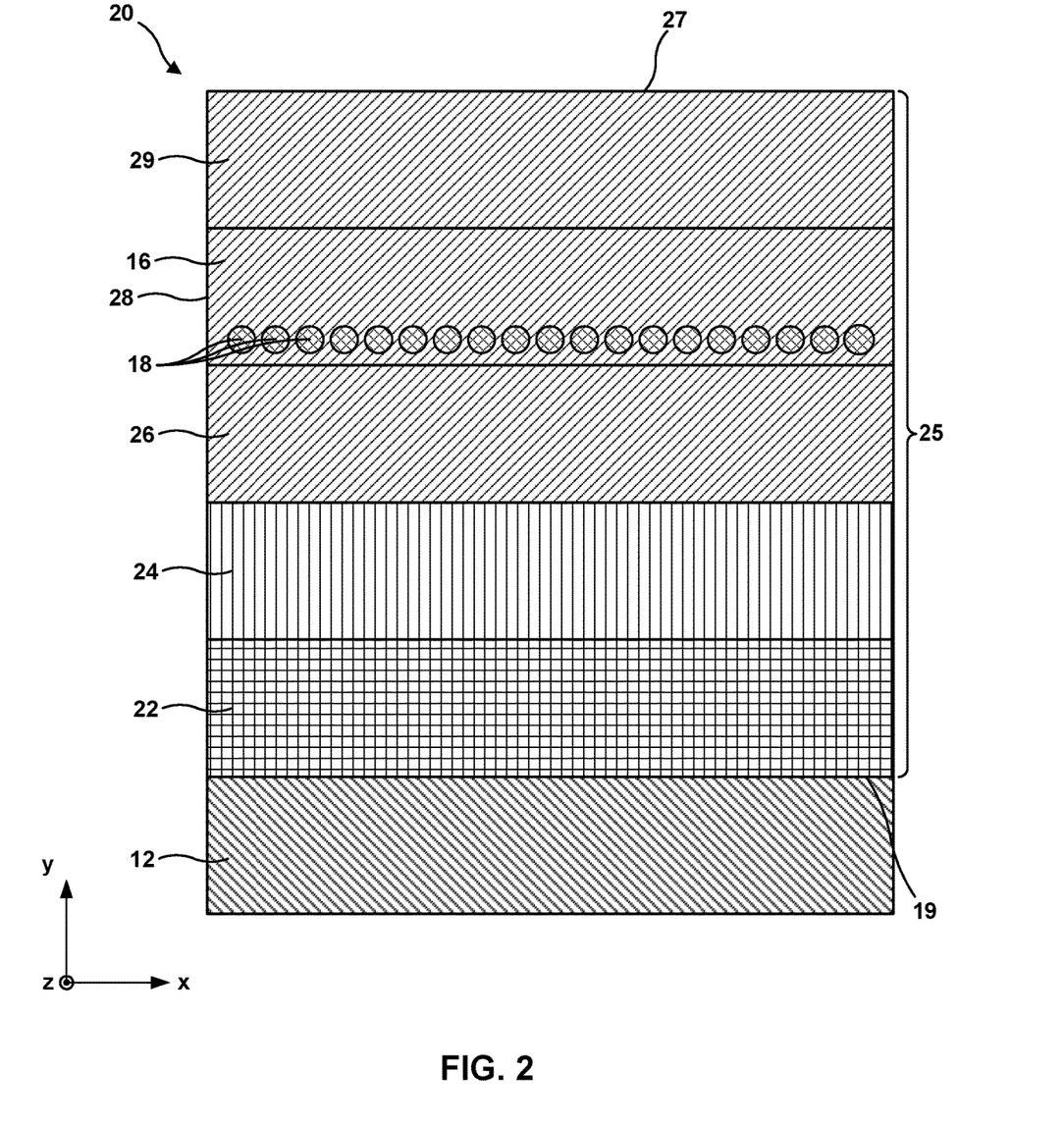
FIG. 2 is a conceptual cross-sectional diagram illustrating another example article that includes an example abradable coating including a plurality of microspheres including at least one rare earth silicate, at least one rare earth oxide, or at least one rare earth silicate and at least one rare earth oxide.

In some examples, instead of including a single layer, an abradable coating may include a plurality of layers, and at least one of the layers may be an abradable layer including a matrix material and a plurality of microspheres. FIG. 2 is a conceptual cross-sectional diagram illustrating another example article 20 that includes an example abradable coating including a plurality of microspheres. In the example of FIG. 2, article 20 that includes a substrate 12, an optional bond layer 22 on a surface 19 of substrate 12, an optional environmental barrier coating (EBC) 24 on bond layer 22, a first abradable layer 26 on EBC 24, a second abradable layer 28 on first abradable layer 26, and a third abradable layer 29 on second abradable layer 28. In the example illustrated in FIG. 2, second abradable layer 28 includes a plurality of microspheres 18 and a matrix material 16.

Article 20 may be similar to or substantially the same as article 10 of FIG. 1, as described above. For example, article 20 may be a component of a high temperature mechanical system, including a gas turbine engine, a turbine blade track, a turbine blade shroud, a turbine blade or a turbine vane.

Substrate 12 may be similar to or substantially the same as substrate 12 of FIG. 1, as described above. For example, substrate 12 may include a metal alloy that includes silicon, a ceramic, or a CMC.

As shown in FIG. 2, article 20 may include a bond layer 22 on substrate 12. Although not illustrated in FIG. 1, in other embodiments, article 20 may not include a bond layer 16. Bond layer 16 may improve adhesion between substrate 12 and the layer overlying bond layer 16 (e.g., second abradable layer 28 in FIG. 2). Bond layer 22 may include any useful material that improves adhesion between substrate 12 and an overlying layer. For example, bond layer 16 may include silicon. Regardless of the composition of bond layer 22, bond layer 22 may have a thickness of between about 25.4 micrometers (µm, about 0.001 inch) and about 254 µm (about 0.01 inch). Bond layer 22 may be formed on substrate 12 using, for example, plasma spraying, physical vapor deposition (PVD), electron beam physical vapor deposition (EB-PVD), directed vapor deposition (DVD), chemical vapor deposition (CVD), cathodic arc deposition slurry process deposition, sol-gel process deposition, electrophoretic deposition, or the like.

In some examples, article 10 does not include bond layer 22. For example, optional EBC 24 may be formed directly on substrate 12. Article 10 may not include bond layer 22 when the layer on substrate 12 and substrate 12 are sufficiently chemically and/or mechanically compatible. For example, in examples where EBC 24 and substrate 12 adhere sufficiently strongly to each other, article 10 may not include bond layer 22. Additionally, in examples where the coefficients of thermal expansion of substrate 12 and EBC 24 are sufficiently similar, article 10 may not include bond layer 22.

EBC 24 is on bond layer 22 and is optional. EBC 24 may reduce or substantially prevent attack of bond layer 22 and/or substrate 12 by chemical species present in the environment in which article 10 is utilized, e.g., in the intake gas or exhaust gas of a gas turbine engine. For example, EBC 24 may include a material that is resistant to oxidation or water vapor attack. EBC 24 may include, for example, at least one of mullite; a glass ceramic such as barium strontium aluminosilicate ($BaO$—$SrO$—$Al_2O_3$-$2SiO_2$; BSAS), calcium aluminosilicate ($CaAl_2Si_2O_8$; CAS), cordierite (magnesium aluminosilicate), and lithium aluminosilicate; or a rare earth silicates (silicates of Lu, Yb, Tm, Er, Ho, Dy, Tb, Gd, Eu, Sm, Pm, Nd, Pr, Ce, La, Y, or Sc). The rare earth silicate may be a rare earth mono-silicate ($RE_2SiO_5$, where RE stands for "rare earth") or a rare earth di-silicate ($RE_2Si_2O_7$, where RE stands for "rare earth"). In some examples, EBC 24 is formed as a substantially non-porous layer, while in other examples, EBC 24 is formed as a layer that includes a plurality of cracks or pores. In some examples, EBC 24 may define a thickness, measured in a direction substantially normal to surface 19 of substrate 12, between 25.4 µm (about 0.001 inch) and 508 µm (about 0.02 inch). EBC 24 may be formed using, for example, CVD; PVD, including EB-PVD and DVD; plasma spraying or another thermal spraying process; or the like.

First abradable layer 26 is on optional EBC 24. When article 20 does not include EBC 24, first abradable layer 26 may be on bond layer 22 or substrate 12 (when both EBC 24 and bond layer 22 are omitted). First abradable layer 26 may include a composition similar to or substantially the same (e.g., the same or nearly the same) as matrix material 16 of FIG. 1. For example, first abradable layer 26 may include at least one of a rare earth silicate, a stabilized zirconium oxide, mullite, or BSAS. First abradable layer 26 defines a thickness, measured in a direction substantially normal to surface 19 of substrate 12, between about 25.4 µm (about 0.001 inch) and about 2.032 mm (about 0.08 inch). First abradable layer 26 may be porous. In some examples, first abradable layer 26 includes porosity between about 25 vol. % and about 50 vol. %. In other examples, first abradable layer 26 includes porosity between about 35 vol. % and about 45 vol. %, or about 40 vol. %. In some examples, the porosity of first abradable layer 26 may be controlled to vary throughout at least a portion of first abradable layer 26. For example, the porosity of abradable layer may be controlled to be lower in a portion of first abradable layer 26 closer to a surface of substrate 12 and greater in a portion of abradable layer further from the surface of substrate 12.

Second abradable layer 28 is on first abradable layer 26. Second abradable layer 28 may be similar to or substantially the same (e.g., the same or nearly the same) as abradable coating 14 of FIG. 1. For example, the composition of second abradable layer 28 may include plurality of microspheres 18 and matrix material 16. Plurality of microspheres 18 may be similar to or substantially the same (e.g., the same or nearly the same) as plurality of microspheres 18 of FIG. 1. Similarly, matrix material 16 may be similar to or substantially the same (e.g., the same or nearly the same) as matrix material 16 of FIG. 1. Matrix material 16 may be same or different than the material in first abradable layer 26.

Second abradable layer 28 defines a thickness, measured in a direction substantially normal to surface 19 of substrate 12, between about 25.4 µm (about 0.001 inch) to about 2.032 mm (about 0.08 inch). Second abradable layer 28 may be formed as a porous structure. In some examples, second abradable layer 28 includes porosity between about 25 vol. % and about 50 vol. %. In other examples, second abradable layer 28 includes porosity between about 35 vol. % and about 45 vol. %, or about 40 vol. %. Similar to first abradable layer 26, in some examples, the porosity of second abradable layer 28 may be controlled to vary throughout the thickness of second abradable layer 28.

Third abradable layer 29 is on second abradable layer 28. In some examples, the composition of third abradable layer 29 may be similar to or substantially the same as first abradable layer 26, matrix material 16 in second abradable layer 28, or both. In some examples, the composition of third abradable layer 29 may be different than the composition of at least one of first abradable layer 26 and matrix material 16. For example, third abradable layer 29 may include at least one of a rare earth silicate, a stabilized zirconium oxide, mullite, or BSAS. Similar to first abradable layer 26 and second abradable layer 28, third abradable layer 29 may define a thickness between about 25.4 µm (about 0.001 inch) to about 2.032 mm (about 0.08 inch). Third abradable layer 29 also may be porous, and may have a porosity between about 25 vol. % and about 50 vol. %, between about 35 vol. % and about 45 vol. %, or about 40 vol. %.

Second abradable layer 28, and, more particularly, the plurality of microspheres 18, may be positioned within coating 25 at a predetermined depth from outer surface 27 of coating 25. In some examples, the predetermined depth may be determined based at least in part on a clearance between a blade tip and substrate 12.

Second abradable layer 28 may facilitate visual determination of a thickness of second abradable layer 28 by including the plurality of microspheres 18 at a predetermined depth within the thickness of the coating 25, In some examples, the visual inspection of coating 25 may occur at room temperature. The plurality of microspheres 18 may possess a visual characteristic under visual or UV-assisted inspection (e.g., color or fluorescence) that is distinct from a visual characteristic of matrix material 16. In some examples, this may facilitate at least one of determination of a remaining life of coating 25, determination of a size, depth, or both of damage to coating 25, or removal and repair of the abradable coating to maintain clearances between coating 25 and a blade tip below a predetermined level to maintain a desired efficiency level of the gas turbine engine.

Figure 3:
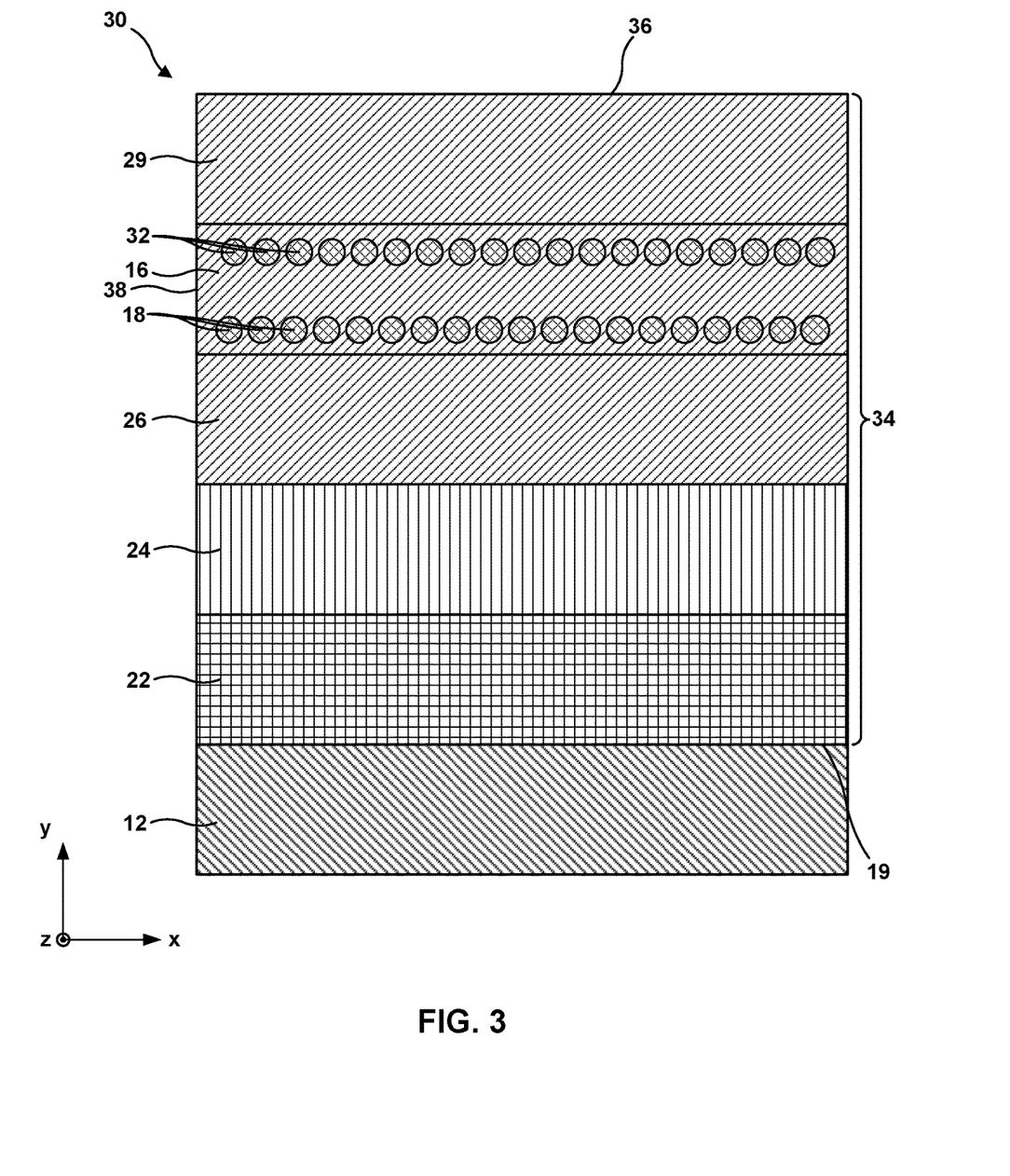
FIG. 3 is a conceptual cross-sectional diagram illustrating another example article that includes an example abradable coating including a plurality of microspheres including at least one rare earth silicate, at least one rare earth oxide, or at least one rare earth silicate and at least one rare earth oxide.

In some examples, rather than including a single type of microspheres, a coating may include multiple types of microspheres in a single layer or in multiple layers of a coating. FIG. 3 is a conceptual diagram illustrating a cross-sectional view of an example article 30 that includes a substrate 12, a bond layer 22, an EBC 24, a first abradable layer 26, a second abradable layer 38, and a third abradable layer 29. In the example illustrated in FIG. 3, second abradable layer 38 includes a first plurality of microspheres 18, a second plurality of microsphere 32, and a matrix material 16.

Article 30 of FIG. 3 may be similar to or substantially the same as article 20 illustrated in and described with respect to FIG. 2, aside from the differences described herein. Unlike article 20 in FIG. 2, article 30 of FIG. 3 includes a second abradable layer 38 that includes first plurality of microspheres 18, second plurality of microspheres 32, and matrix material 16.

First plurality of microspheres 18 and second plurality of microspheres 32 may be similar to or substantially the same as plurality of microspheres 18 of FIG. 1. For example, first plurality of microspheres 18 and second plurality of microspheres 32 may include at least one rare earth silicate, at least one rare earth oxide, or at least one rare earth silicate and at least one rare earth oxide. In some examples, the composition of first plurality of microspheres 18 may be different than the composition of second plurality of microspheres 32. For example, first plurality of microspheres 18 may include a first rare earth silicate, and second plurality of microspheres 32 may include a second, different rare earth silicate. First plurality of microspheres 18 may be located at a first predetermined depth from an outer surface 36 of coating 34. As shown in FIG. 3, second plurality of microspheres 32 may be located at a second predetermined depth from outer surface 36. The first and second predetermined depth are different from each other. First plurality of microspheres 18 may possess a visual characteristic under visual or UV-assisted inspection that is distinct from a visual characteristic of matrix material 16 and a visual characteristic of second plurality of microspheres 32.

Coating 34 illustrated in FIG. 3, which includes first and second plurality of microspheres 18, 32 facilitates visual determination of a thickness of second abradable layer 28 at two predetermined depths within the thickness of coating 34. As described above, the plurality of microspheres may be used to determine a remaining thickness of coating 34. A coating including microspheres located at multiple, different depths from outer surface 36 may facilitate more precise determination of the remaining thickness of coating 34. Although FIG. 3 illustrates an example in which second abradable layer 38 includes two types of microspheres 18 and 32, in other examples, second abradable layer 38 may include more than two types of microspheres. For example, second abradable layer 38 may include a plurality of types of microspheres or at least two types of microspheres.

Figure 4:
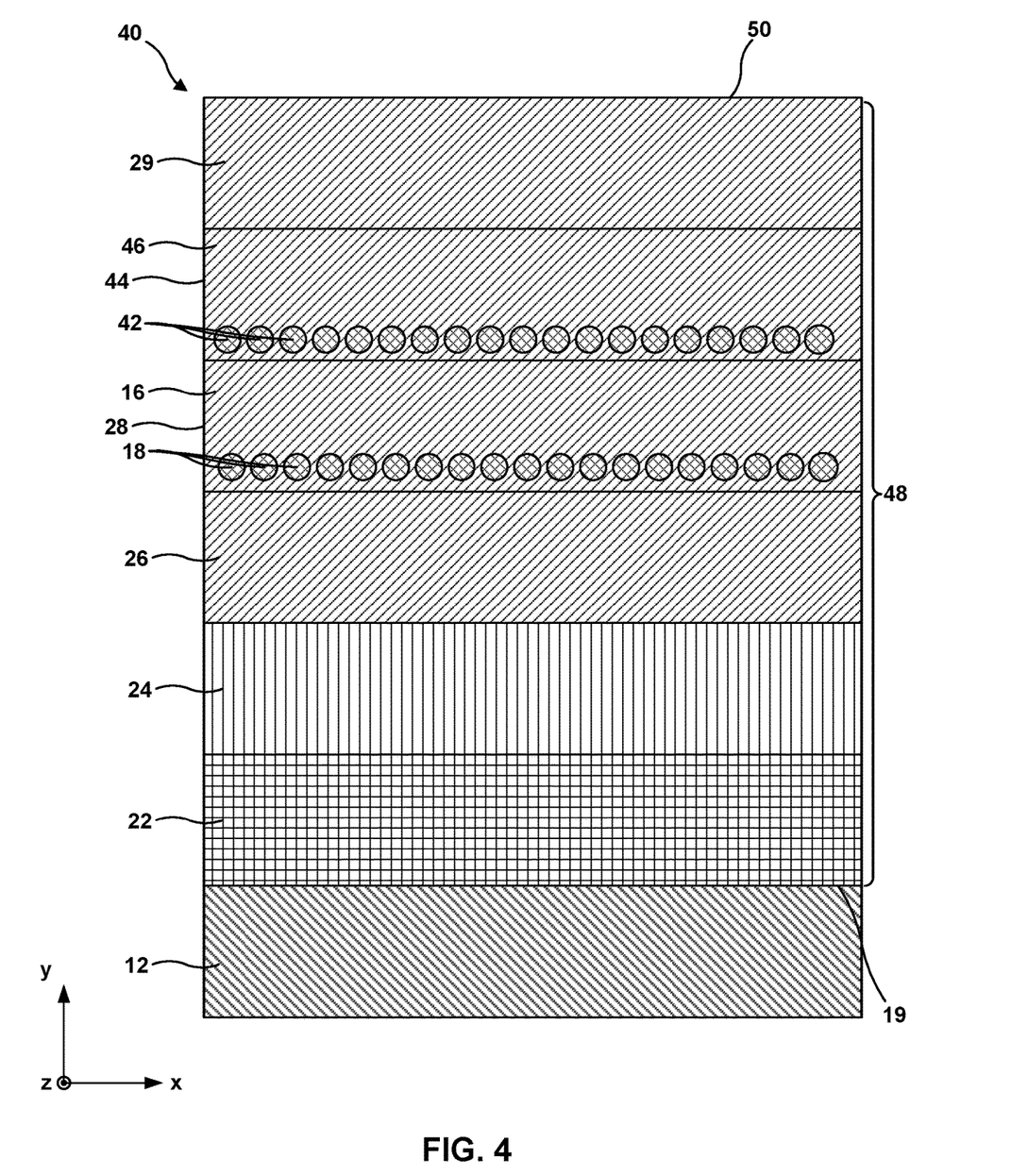
FIG. 4 is a conceptual cross-sectional diagram illustrating another example article that includes an example abradable coating including a plurality of microspheres including at least one rare earth silicate, at least one rare earth oxide, or at least one rare earth silicate and at least one rare earth oxide.

In the example illustrated in FIG. 3, first plurality of microspheres 18 and second plurality of microspheres 32 are disposed within the same layer of coating 34 (second abradable layer 38). In other examples, first plurality of microspheres 18 and second plurality of microspheres 32 may be disposed in different layers of a coating. FIG. 4 is a conceptual cross-sectional diagram illustrating another example article 40 that includes an example coating 48 including a plurality of microspheres. Article 40 includes a substrate 12, a bond layer 22 on substrate 12, an EBC 24 on bond layer 22, a first abradable layer 26 on EBC 24, a second abradable layer 28 on first abradable layer 26, a third abradable layer 44 on second abradable layer 44, and a fourth abradable layer 29 on third abradable layer 44. Article 40 of FIG. 4 may be similar to or substantially the same as article 20 illustrated in and described with respect to FIG. 2, aside from the differences described herein. In the example illustrated in FIG. 4, second abradable coating 28 includes a first plurality of microspheres 18 and a matrix material 16, and third abradable layer 44 includes a second plurality of microspheres 42 and a matrix material 46.

First plurality of microspheres 18 and second plurality of microspheres 42 may be similar to or substantially the same as plurality of microspheres 18 of FIG. 1. For example, first plurality of microspheres 18 and second plurality of microspheres 42 may include at least one rare earth silicate. In some examples, the composition of first plurality of microspheres 18 may be different than the composition of second plurality of microspheres 42. For example, first plurality of microspheres 18 may include a first rare earth silicate, and second plurality of microspheres 42 may include a second, different rare earth silicate. First plurality of microspheres 18 may be located in second abradable layer 28 at a first predetermined depth from an outer surface 50 of coating 48. As shown in FIG. 4, second plurality of microspheres 42 may be located in third abradable layer 44 at a second predetermined depth from outer surface 50. The first and second predetermined depths are different from each other. First plurality of microspheres 18 may possess a visual characteristic under visual or UV-assisted inspection that is distinct from a visual characteristic of matrix material 16 and second plurality of microspheres 42 may possess a visual characteristic that is distinct from a visual characteristic of matrix material 46. In some examples, the visual characteristic of first plurality of microspheres 18 is different from the visual characteristic of second plurality of microspheres 42.

Coating 48 illustrated in FIG. 4, which includes first and second plurality of microspheres 18 and 42 facilitates visual determination of a thickness of coating 48 at two predetermined depths within the thickness of coating 48. As described above, the plurality of microspheres may be used to determine a remaining thickness of the coating 48. A coating 48 including microspheres located at multiple, different depths from outer surface 50 may facilitate more precise determination of the remaining thickness of coating 48. Although FIG. 4 illustrates an example in which coating 48 includes two abradable layers 28 and 44 including a respective plurality of microspheres 18 and 42, in other examples, coating 48 may include more than two layers including microspheres. For example, coating 48 may include a plurality of layers including microspheres or at least two layers including microspheres.

As described above, in some examples, the layers including a plurality of microspheres may be formed using air plasma spraying (APS). FIGS. 5A and 5B are conceptual diagrams illustrating example techniques for forming an abradable coating 14 including a plurality of microspheres 18 using air plasma spraying. In the examples illustrated in FIGS. 5A and 5B, an article 10 includes an abradable coating 14 on surface 19 of substrate 12. Abradable coating 14 includes a plurality of microspheres 18 and a matrix material 16. The APS technique may utilize an APS gun 52 to spray plurality of microspheres 18 and matrix material 16 onto surface 19 of substrate 12.

Figure 5A:
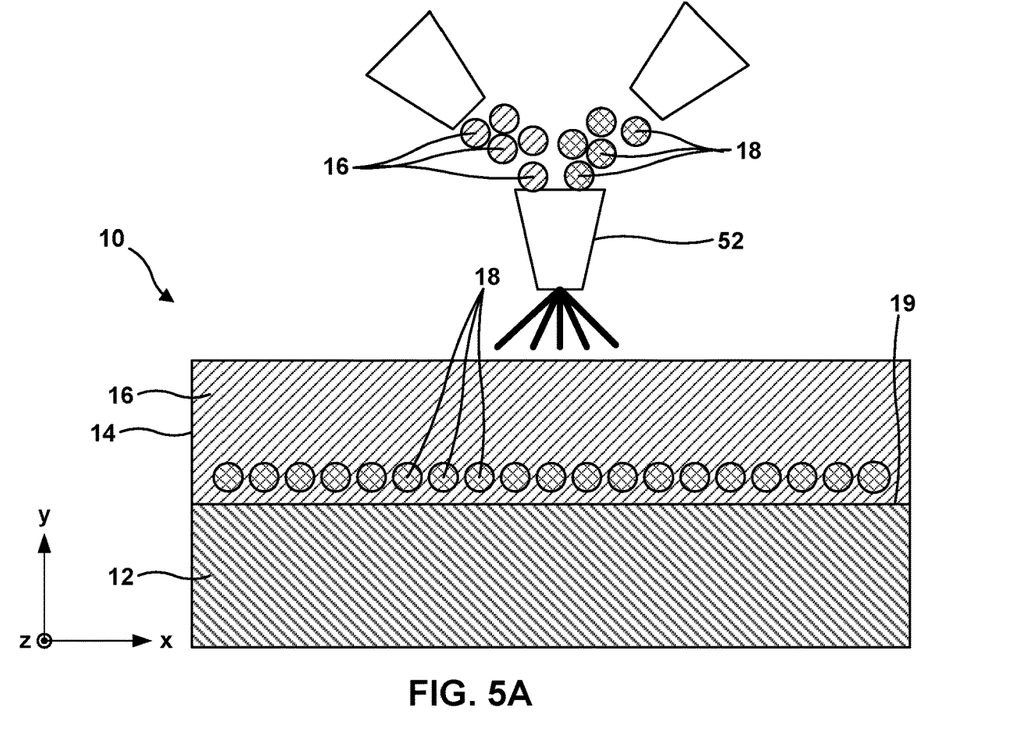
FIGS. 5A and 5B are conceptual diagrams illustrating example techniques for forming an abradable coating including a plurality of microspheres including at least one rare earth silicate, at least one rare earth oxide, or at least one rare earth silicate and at least one rare earth oxide using air plasma spraying.
Figure 5B:
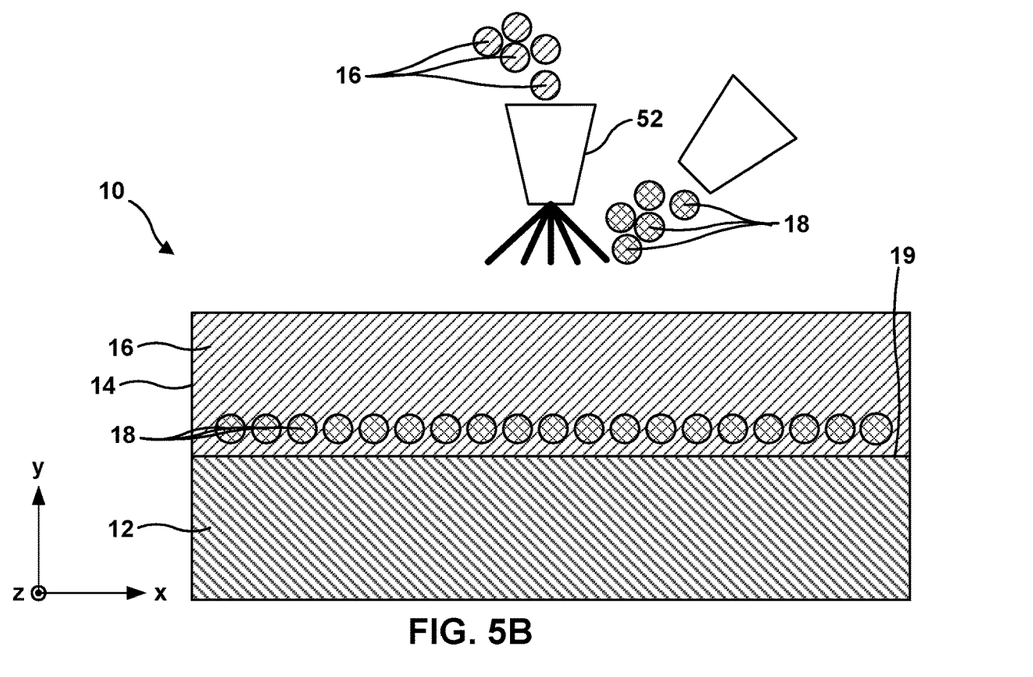

In the example illustrated in FIG. 5A, plurality of microspheres 18 and matrix material 16 in powder form may be mixed upstream of APS gun 52, then sprayed onto abradable coating 14. In some examples, the plurality of microspheres 18 may be deformed during the APS technique when passed through the APS gun 52, e.g., due to softening or melting of the plurality of microspheres 18. Hence, in some examples, rather than the plurality of microspheres 18 being mixed with matrix material 16 upstream of APS gun 52, the plurality of microspheres 18 and matrix material 16 may be mixed downstream of APS gun 52, as shown in FIG. 5B.

Figure 6:
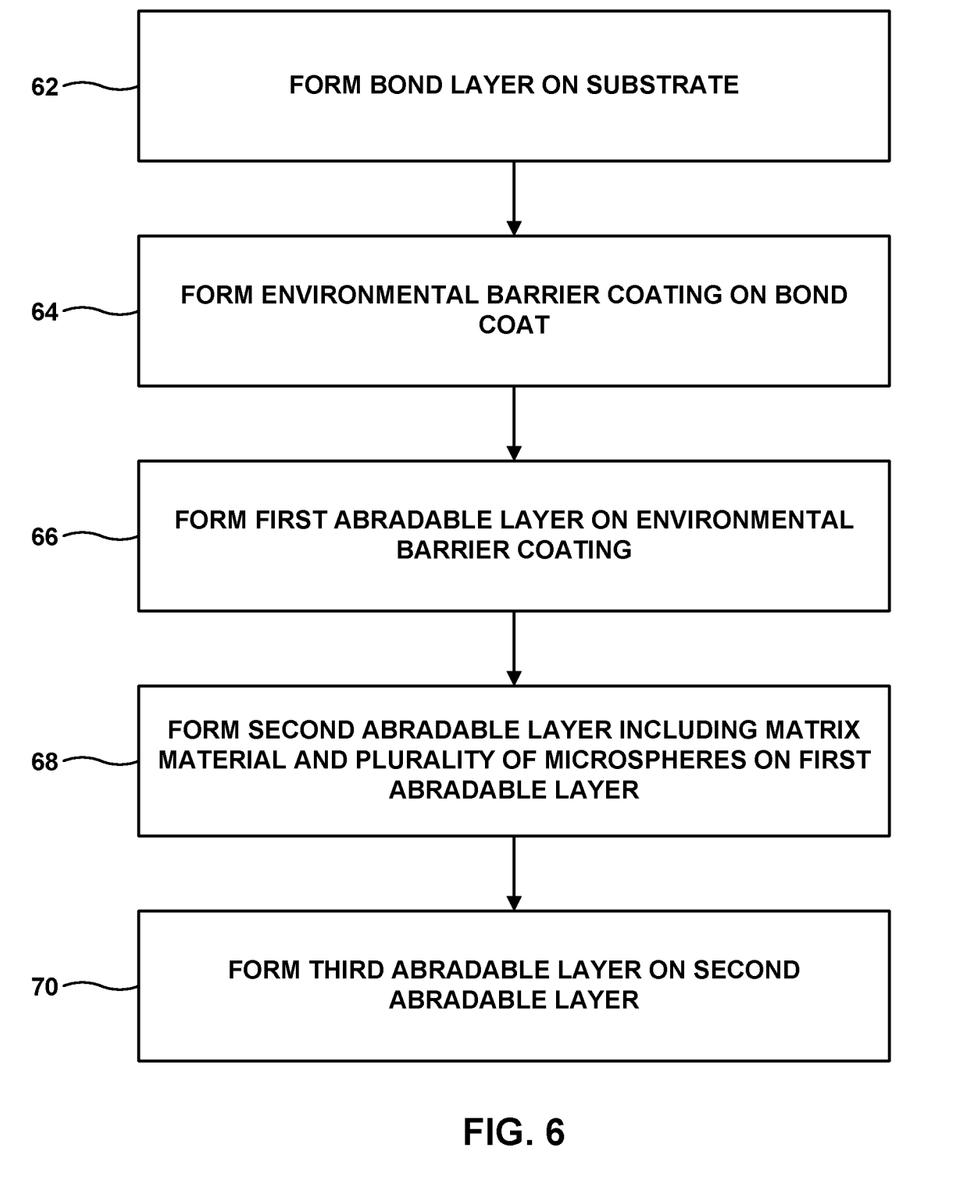
FIG. 6 is a flow diagram illustrating an example technique for forming an example abradable coating including a plurality of microspheres including at least one rare earth silicate, at least one rare earth oxide, or at least one rare earth silicate and at least one rare earth oxide.

FIG. 6 is a flow diagram illustrating an example technique for forming an example abradable coating including a plurality of microspheres. The technique of FIG. 6 will be described with respect to article 20 of FIG. 2. However, the technique of FIG. 6 may be used to form other articles, and article 20 of FIG. 2 may be formed using other techniques. In the example illustrated in FIG. 6, the technique optionally includes forming bond layer 22 on substrate 12 (62). Bond layer 22 may be formed on substrate 12 using plasma spraying; PVD, such as EB-PVD or DVD; CVD; cathodic arc deposition; slurry deposition; sol-gel deposition; electrophoretic deposition; or the like. In some examples, article 20 does not include bond layer 22, and the technique of FIG. 6 does not include forming bond layer 22 on substrate 12 (62).

The technique also optionally includes forming EBC 24 on optional bond layer 22 (or substrate 12 if bond layer 22 is not present) (66). EBC 24 may be formed using, for example, CVD; PVD, including EB-PVD and DVD; plasma spraying or another thermal spraying process; or the like. In some examples, article 20 does not include EBC 24, and the technique of FIG. 6 does not include forming EBC 24 on bond layer 22 (or substrate 12 if bond layer 22 is not present) (62).

The technique of FIG. 6 also includes forming an optional first abradable layer 26 on EBC 24 (66). As both EBC 24 and bond layer 22 are optional, first abradable layer 26 also may be formed on bond layer 22 or substrate 12. When present in coating 25, first abradable layer 26 may be formed using, for example, a thermal spraying technique, such as air plasma spraying or the like.

The technique of FIG. 6 also includes forming second abradable layer 28 on optional first abradable layer 26 (68). As first abradable layer 26, EBC 24 and bond layer 22 are optional, second abradable layer 28 also may be formed on EBC 24, bond layer 22, or substrate 12. In some examples, second abradable layer 28 may be formed using air plasma spraying, such as one of the technique illustrated with respect to FIGS. 5A and 5B. In other examples, plurality of microspheres 18 may be applied directly to the surface of the underlying layer (e.g., the surface of first abradable layer 26). The plurality of microspheres 18 may be deposited using slurry deposition or application of an adhesive loaded with the plurality of microspheres 18. After application of the plurality of microspheres, matrix material 16 is applied, e.g., using or slurry deposition, to form second abradable layer 28.

The technique of FIG. 6 further optionally includes forming third abradable layer 29 on second abradable layer 28 (70). When present in coating 25, third abradable layer 29 may be formed using, for example, a thermal spraying technique, such as air plasma spraying or the like.

Figure 7:
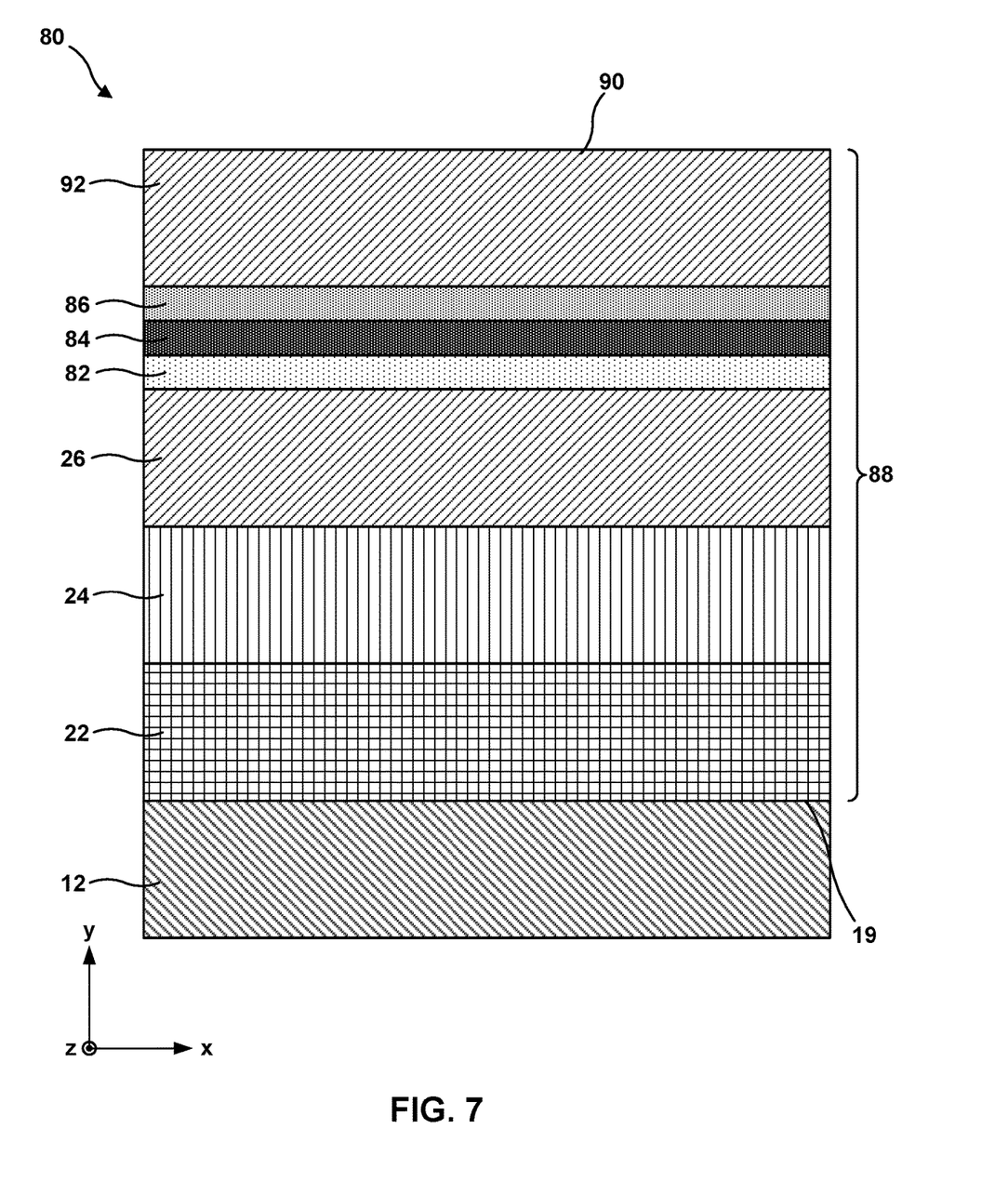
FIG. 7 is a conceptual cross-sectional diagram illustrating another example article that includes an example coating including a neodymium silicate layer, an erbium silicate layer, and a gadolinium silicate layer.

In some examples, rather than including a plurality of microspheres that have a visual characteristic distinct from a visual characteristic of surrounding matrix material, a coating may include a plurality of layers within the coating that each have distinct visual characteristics compared to surrounding layers. FIG. 7 is a conceptual cross-sectional diagram illustrating another example article that includes an example coating 88 including a neodymium silicate layer, an erbium silicate layer, and a gadolinium silicate layer.

Article 80 of FIG. 7 may be similar to or substantially the same as article 20 illustrated in and described with respect to FIG. 2, aside from the differences described herein. For example, substrate 12, bond layer 22, EBC 24, and first abradable layer 26, may be similar to or substantially the same as the corresponding structures described with respect to FIG. 2. Second abradable layer 92 may be similar to or substantially the same as third abradable layer 29 in FIG. 2. Unlike article 20 in FIG. 2, article 80 of FIG. 7 includes at least one neodymium silicate layer 82, at least one erbium silicate layer 84, and at least one gadolinium silicate layer 86.

At least one neodymium silicate layer 82, at least one erbium silicate layer 84, and at least one gadolinium silicate layer 86 are between first abradable layer 26 and second abradable layer 92. Although FIG. 7 illustrates at least one gadolinium silicate layer 86 on at least one erbium silicate layer 84 and at least one erbium silicate layer 84 on at least one neodymium silicate layer 82, in other examples, the order of these layers may be changed into any order. Additionally or alternatively, coating 88 may include more than one of at least one neodymium silicate layer 82, more than one of at least one erbium silicate layer 84, or more than one of at least one gadolinium silicate layer 86. In some examples, coating 88 may include multiple sets of at least one neodymium silicate layer 82, at least one erbium silicate layer 84, and at least one gadolinium silicate layer 86. In other examples, coating 88 may include a different numbers of the at least one neodymium silicate layer 82, at least one erbium silicate layer 84, and at least one gadolinium silicate layer 86 (e.g., more neodymium silicate layers 82 than erbium silicate layers 84 and gadolinium silicate layers 86, or the like).

At least one neodymium silicate layer 82 may include neodymium monosilicate or neodymium disilicate. At least one erbium silicate layer 84 may include erbium monosilicate or erbium disilicate. At least one gadolinium silicate layer 86 may include gadolinium monosilicate, or gadolinium disilicate. In some examples, The erbium monosilicate, erbium disilicate, neodymium monosilicate, neodymium disilicate, gadolinium monosilicate, or gadolinium disilicate may be doped with between about 0.1 at. % and about 10 at. % of an element selected from the Lanthanide series of the periodic table, excluding ytterbium.

At least one neodymium silicate layer 82, at least one erbium silicate layer 84, and at least one gadolinium silicate layer 86 may be located at respective a predetermined depths from an outer surface 90 of coating 88. In some examples, at least one neodymium silicate layer 82, at least one erbium silicate layer 84, and at least one gadolinium silicate layer 86 each defines a thickness, measured in a direction substantially normal to surface 19 of substrate 12, of between about 25.4 µm (about 0.001 inch) and about 2.032 mm (about 0.08 inch). The thicknesses of at least one neodymium silicate layer 82, at least one erbium silicate layer 84, and at least one gadolinium silicate layer 86 may be the same or may be different. The positions and thicknesses of at least one neodymium silicate layer 82, at least one erbium silicate layer 84, and at least one gadolinium silicate layer 86 may be determined from clearance requirements between the blade and seal segment (or blade track), such that the layers 82, 84, and 86 are located at a depth from surface 90 that approximate corresponds to an depth to which coating 88 is abraded during use. At least one neodymium silicate layer 82, at least one erbium silicate layer 84, and at least one gadolinium silicate layer 86 may be applied by APS or by physical vapor deposition (e.g., EB-PVD, DVD, or the like).

Each of layers 82, 84, and 86 possesses a distinct visual characteristic (e.g., color) that is different than a visual characteristic of an adjacent layer. Layers 82, 84, and 86 may facilitate visual inspection of a thickness of coating 88 by including the plurality of layers 82,84, and 86 at a predetermined depth within the thickness of coating 88. In some examples, this visual inspection may occur at room temperature. Coating 88, which includes a plurality of layers 82, 84, and 86 (e.g., at least three) located at multiple, different depths from outer surface 88, may facilitate more precise determination of the remaining thickness of coating 88. In some examples, this may facilitate at least one of determination of a remaining life of the coating 88, determination of a size, depth, or both of damage to coating 88, or removal and repair of coating 88 to maintain clearances between coating 88 and a blade tip below a predetermined level to maintain a desired efficiency level of the gas turbine engine.

Clause 1: An article comprising: a substrate; and a coating on the substrate, wherein the coating comprises at least one abradable layer, wherein the at least one abradable layer comprises a matrix material and a plurality of microspheres located within the at least one abradable layer at a predetermined depth from an outer surface of the coating, wherein the plurality of microspheres define a visual characteristic distinct from the matrix material, and wherein the plurality of microspheres comprise at least one rare earth oxide, at least one rare earth silicate, or at least one rare earth oxide and at least one rare earth silicate.

Clause 2: The article of clause 1, wherein the coating further comprises an environmental barrier coating layer, wherein the environmental barrier coating layer comprises at least one rare earth silicate, and wherein the environmental barrier coating layer is between the substrate and the at least one abradable layer.

Clause 3: The article of clause 1 or 2, wherein the coating further comprises a bond layer between the substrate and the at least one abradable layer, wherein the bond layer comprises silicon.

Clause 4: The article of any one of clauses 1 to 3, wherein the at least one abradable layer comprises a first abradable layer and a second abradable layer, wherein the second abradable layer is on the first abradable layer, wherein the second abradable layer comprises the plurality of microspheres, and wherein the first abradable layer does not comprises microspheres.

Clause 5: The article of clause 4, wherein the at least one abradable layer further comprises a third abradable layer, wherein the third abradable layer is on the second abradable layer, and wherein the third abradable layer does not comprises microspheres.

Clause 6: The article of any one of clauses 1 to 3, wherein the plurality of microspheres comprise a first plurality of microspheres defining a first visual characteristic distinct from the matrix material, wherein the at least one abradable layer further comprises a second plurality of microspheres defining a second visual characteristic distinct from the matrix material and the first visual characteristic, wherein the first plurality of microspheres are located within the at least one abradable layer at a first predetermined depth from an outer surface of the abradable coating, and wherein the second plurality of microspheres are located within the at least one abradable layer at a second, different predetermined depth from an outer surface of the abradable coating.

Clause 7: The article of clause 6, wherein the first plurality of microspheres are located within the same abradable layer of the at least one abradable layer as the second plurality of microspheres.

Clause 8: The article of clause 6, wherein the first plurality of microspheres are located within a different abradable layer of the at least one abradable layer than the second plurality of microspheres.

Clause 9: The article of any one of clauses 1 to 8, wherein the plurality of microspheres comprises microspheres comprising at least one of yttrium monosilicate, yttrium disilicate, ytterbium monosilicate, ytterbium disilicate, erbium monosilicate, erbium disilicate, neodymium monosilicate, neodymium disilicate, gadolinium monosilicate, or gadolinium disilicate.

Clause 10: The article of clause 9, wherein the microspheres comprising the at least one of yttrium monosilicate, yttrium disilicate, ytterbium monosilicate, ytterbium disilicate, erbium monosilicate, erbium disilicate, neodymium monosilicate, neodymium disilicate, gadolinium monosilicate, or gadolinium disilicate further comprise between about 0.1 atomic percent (at. %) and about 10 at. % of an element selected from the Lanthanide series of the periodic table, excluding ytterbium.

Clause 11: An article comprising: a substrate; a coating on the substrate, wherein the coating comprises: at least one abradable layer; a neodymium silicate layer; an erbium silicate layer; and a gadolinium silicate layer, wherein the neodymium silicate layer, the erbium silicate layer, and the gadolinium silicate layer are adjacent to each other within the abradable coating.

Clause 12: The article of clause 11, wherein the at least one abradable layer comprises a first abradable layer and a second abradable layer, and wherein the neodymium silicate layer, the erbium silicate layer, and the gadolinium silicate layer are between the first abradable layer and the second abradable layer.

Clause 13: The article of clause 11 or 12, wherein the coating further comprises an environmental barrier coating layer, wherein the environmental barrier coating layer comprises at least one rare earth silicate, and wherein the environmental barrier coating layer is between the substrate and the at least one abradable layer.

Clause 14: The article of any one of clauses 11 to 13, wherein the coating further comprises a bond layer between the substrate and the at least one abradable layer, wherein the bond layer comprises silicon.

Clause 15: A method comprising: forming a coating on a substrate, wherein the coating comprises at least one abradable layer, wherein the at least one abradable layer comprises a matrix material and a plurality of microspheres located within the at least one abradable layer at a predetermined depth from an outer surface of the abradable coating, and wherein the plurality of microspheres define a visual characteristic distinct from the matrix material, and wherein the plurality of microspheres comprise at least one rare earth oxide, at least one rare earth silicate, or at least one rare earth oxide and at least one rare earth silicate.

Clause 16: The method of clause 15, wherein forming the coating on the substrate comprises air plasma spraying the at least one abradable layer over the substrate.

Clause 17: The method of clause 16, further comprising mixing the plurality of microspheres with the matrix material upstream of the air plasma spray gun.

Clause 18: The method of clause 16, further comprising mixing the plurality of microspheres with the matrix material downstream of the air plasma spray gun.

Clause 19: The method of clause 15, wherein forming the coating on the substrate comprises: applying the plurality of microspheres to a surface of a first abradable layer of the at least one abradable layer with an adhesive; and depositing a matrix material around the plurality of microspheres to form a second abradable layer comprising the matrix material and the plurality of microspheres.

Clause 20: The method of any one of clauses 15 to 19, wherein the matrix material comprises a rare earth silicate.

Clause 21: The method of any one of clauses 15 to 20, wherein the plurality of microspheres comprises microspheres comprising at least one of yttrium monosilicate, yttrium disilicate, ytterbium monosilicate, ytterbium disilicate, erbium monosilicate, erbium disilicate, neodymium monosilicate, neodymium disilicate, gadolinium monosilicate, or gadolinium disilicate.

Clause 22: The method of clause 21, wherein the microspheres comprising at least one of yttrium monosilicate, yttrium disilicate, ytterbium monosilicate, ytterbium disilicate, erbium monosilicate, erbium disilicate, neodymium monosilicate, neodymium disilicate, gadolinium monosilicate, or gadolinium disilicate further comprise between about 0.1 atomic percent (at. %) and about 10 at. % of an element selected from the Lanthanide series of the periodic table, excluding ytterbium.

Clause 23: A method comprising: forming a coating on a substrate, wherein the coating comprises: at least one abradable layer; at least one neodymium silicate layer; at least one erbium silicate layer; and at least one gadolinium silicate layer, wherein the at least one neodymium silicate layer, the at least one erbium silicate layer, and the at least one gadolinium silicate layer are adjacent to each other or staggered within the abradable coating.

Clause 24: The method of clause 23, the at least one abradable layer comprises a first abradable layer and a second abradable layer, and wherein forming the coating on the substrate comprises forming the at least one neodymium silicate layer, the at least one erbium silicate layer, and the at least one gadolinium silicate layer on the first abradable layer and forming the second abradable layer on the neodymium silicate layer, the erbium silicate layer, and the gadolinium silicate layer.

Clause 25: The method of clause 23 or 24, wherein the coating further comprises an environmental barrier coating layer, and wherein forming the coating on the substrate comprises forming the environmental barrier coating layer over the substrate and forming the at least one abradable layer over the environmental barrier coating layer.

Clause 26: The method of any one of clauses 23 to 25, wherein the coating further comprises a bond layer, wherein forming the coating on the substrate comprises forming the bond layer on the substrate, and wherein the bond layer comprises silicon.

Clause 27: A method comprising: visually inspecting a coating, wherein the coating comprises at least one abradable layer, wherein the at least one abradable layer comprises a matrix material and a plurality of microspheres located within the at least one abradable layer at a predetermined depth from an outer surface of the coating, and wherein the plurality of microspheres define a visual characteristic distinct from the matrix material, and wherein the plurality of microspheres comprise at least one rare earth oxide, at least one rare earth silicate, or at least one rare earth oxide and at least one rare earth silicate; and determining a wear level of the abradable coating based at least in part on observation of at least one of the plurality of microspheres.

Clause 28: The method of clause 27, wherein visually inspecting the coating is performed at room temperature.

Although the forgoing description has primarily been directed to abradable coatings, in other examples, the subject matter described herein may be applied to coatings of other types, such as abrasive coatings, thermal barrier coatings, environmental barrier coatings, self-lubricating coatings, or the like. The layer structure and compositions may differ for these different applications, but layers including a plurality of microspheres in a matrix material or a plurality of layers with distinct visual characteristics may also be used in these other coating systems.

Various examples have been described. These and other examples are within the scope of the following claims.

The invention claimed is:

1. An article comprising:
a substrate; and
a coating on the substrate, wherein the coating comprises an abradable layer, wherein the abradable layer comprises a matrix material and a plurality of microspheres located within the abradable layer at a predetermined depth from an outer surface of the abradable layer, wherein the plurality of microspheres define a visual characteristic distinct from the matrix material, and wherein the plurality of microspheres comprise (1) at least one of yttrium monosilicate, yttrium disilicate, ytterbium monosilicate, ytterbium disilicate, erbium monosilicate, erbium disilicate, neodymium monosilicate, neodymium disilicate, gadolinium monosilicate, or gadolinium disilicate, and (2) between about 0.1 atomic percent (at. %) and about 10 at. % of an element selected from the Lanthanide series of the periodic table, excluding ytterbium.

2. The article of claim 1, wherein the coating further comprises an environmental barrier coating layer, wherein the environmental barrier coating layer comprises at least one rare earth silicate, and wherein the environmental barrier coating layer is between the substrate and the abradable layer.

3. The article of claim 1, wherein the coating further comprises a bond layer between the substrate and the abradable layer, wherein the bond layer comprises silicon.

4. The article of claim 1, wherein the abradable layer comprises a first abradable layer, further comprising a second abradable layer, wherein the first abradable layer is on the second abradable layer, wherein the first abradable layer comprises the plurality of microspheres, and wherein the second abradable layer does not comprise microspheres.

5. The article of claim 4, further comprising a third abradable layer, wherein the third abradable layer is on the first abradable layer, and wherein the third abradable layer does not comprise microspheres.

6. The article of claim 1, wherein the plurality of microspheres comprise a first plurality of microspheres defining a first visual characteristic distinct from the matrix material, wherein the abradable layer further comprises a second plurality of microspheres defining a second visual characteristic distinct from the matrix material and the first visual characteristic, wherein the first plurality of microspheres are located within the abradable layer at a first predetermined depth from the outer surface of the abradable layer, and wherein the second plurality of microspheres are located within the abradable layer at a second, different predetermined depth from the outer surface of the abradable layer.

7. A method comprising:
forming a coating on a substrate, wherein the coating comprises an abradable layer, wherein the abradable layer comprises a matrix material and a plurality of microspheres located within the abradable layer at a predetermined depth from an outer surface of the abradable layer, wherein the plurality of microspheres define a visual characteristic distinct from the matrix material, and wherein the plurality of microspheres comprise (1) at least one of yttrium monosilicate, yttrium disilicate, ytterbium monosilicate, ytterbium disilicate, erbium monosilicate, erbium disilicate, neodymium monosilicate, neodymium disilicate, gadolinium monosilicate, or gadolinium disilicate, and (2) between about 0.1 atomic percent (at. %) and about 10 at. % of an element selected from the Lanthanide series of the periodic table, excluding ytterbium.

8. The method of claim 7, wherein forming the coating on the substrate comprises air plasma spraying the abradable layer over the substrate.

9. The method of claim 7, wherein the abradable layer comprises a second abradable layer, and wherein forming the coating on the substrate comprises:
  applying the plurality of microspheres to a surface of a first abradable layer with an adhesive; and
  depositing a matrix material around the plurality of microspheres to form the second abradable layer comprising the matrix material and the plurality of microspheres.

10. The method of claim 7, wherein the matrix material comprises a rare earth silicate.

\* \* \* \* \*